(12) United States Patent
Mansfield et al.

(10) Patent No.: US 6,421,820 B1
(45) Date of Patent: Jul. 16, 2002

(54) SEMICONDUCTOR DEVICE FABRICATION USING A PHOTOMASK WITH ASSIST FEATURES

(75) Inventors: Scott M. Mansfield, Hopewell Junction; Lars W. Liebmann, Poughquag; Shahid Butt, Ossining; Henning Haffner, Fishkill, all of NY (US)

(73) Assignees: Infineon Technologies AG, Munich (DE); Internation Business Machines Corporation, Armonk, NY (US)

( * ) Notice: Subject to any disclaimer, the term of this patent is extended or adjusted under 35 U.S.C. 154(b) by 0 days.

(21) Appl. No.: 09/460,034

(22) Filed: Dec. 13, 1999

(51) Int. Cl.$^7$ .................. G06F 17/50; G06F 19/00; G06F 9/42; G21K 5/00; G03F 9/00

(52) U.S. Cl. ................. 716/21; 716/18; 716/2; 700/105; 700/120; 700/121; 700/103; 430/5; 378/35; 382/144

(58) Field of Search ............... 716/1–21; 700/97, 700/103, 105, 117–121; 430/4–5; 378/34–35; 382/141–151; 438/378

(56) References Cited

U.S. PATENT DOCUMENTS

| | | | |
|---|---|---|---|
| 5,242,770 A | | 9/1993 | Chen et al. ............... 430/5 |
| 5,256,505 A | | 10/1993 | Chen et al. ............... 430/5 |
| 5,316,896 A | * | 5/1994 | Fukuda et al. ........... 430/322 |
| 5,397,663 A | * | 3/1995 | Uesawa et al. ........... 430/5 |
| 5,416,722 A | * | 5/1995 | Edwards .................. 716/2 |
| 5,447,810 A | | 9/1995 | Chen et al. ............... 430/5 |
| 5,468,578 A | * | 11/1995 | Rolfson ................... 430/5 |
| 5,472,814 A | * | 12/1995 | Lin ........................ 430/5 |

(List continued on next page.)

OTHER PUBLICATIONS

Goda et al. ("Impact of RSF with variable coefficients for CD variaton analysis including OPC", 1999 4th International Workshop on ULSI Process Technol. Dev. Cetner, Matsushita Electron Corp., Japan, Jun. 12, 1999, pp. 62–65).*
Garofalo et al. ("Automatic proximity correction for 0.35/spl mu/m 1–line photolithography", International Workshop on Numerical Modeling of Processes and Devices for Integrated Circuits, Jun. 5, 1994 , pp. 92–94).*
Balasinski et al. ("A novel approach to simulate the effect of optical proximity on MOSFET parametric yield", International Electron Devices Meeting, IEMD Technical Digest, Dec. 5, 1999, pp. 913–916).*
"Taurua–OPC", htpp://www.avanticorp.com/Avant!/SolutionsProducts/Products/Item/1.1172.33.00.html, downloaded Sep. 29, 1999.

Primary Examiner—Matthew Smith
Assistant Examiner—Phallaka Kik
(74) Attorney, Agent, or Firm—Stanton Braden (57) ABSTRACT

A semiconductor device can be fabricated using a photomask that has been modified using an assist feature design method (see e.g., FIG. 4A) based on normalized feature spacing. Before the device can be fabricated, a layout of original shapes is designed (402). For at least some of the original shapes, the width of the shape and a distance to at least one neighboring shape are measured (404). A modified shape can then be generated by moving edges of the original shape based on the width and distance measurements (406). This modification can be performed on some or all of the original shapes (408). For each of the modified shapes, a normalized space and correct number of assist features can be computed (410). The layout is then modified by adding the correct number of assist features in a space between the modified shape and the neighboring shape (412). This modified layout can then be used in producing a photomask, which can in turn be used to produce a semiconductor device.

44 Claims, 11 Drawing Sheets

U.S. PATENT DOCUMENTS

| | | | |
|---|---|---|---|
| 5,536,604 A | * 7/1996 | Ito | 430/5 |
| 5,663,893 A | 9/1997 | Wampler et al. | 716/19 |
| 5,707,765 A | 1/1998 | Chen | 430/5 |
| 5,723,233 A | 3/1998 | Garza et al. | 430/5 |
| 5,740,068 A | 4/1998 | Liebmann et al. | 716/21 |
| 5,786,115 A | * 7/1998 | Kawabata et al. | 430/5 |
| 5,789,117 A | * 8/1998 | Chen | 430/5 |
| 5,821,014 A | 10/1998 | Chen et al. | 430/5 |
| 5,827,623 A | 10/1998 | Ishida et al. | 430/5 |
| 5,851,702 A | 12/1998 | Watanabe et al. | 430/5 |
| 5,862,058 A | * 1/1999 | Samuels et al. | 716/21 |
| 5,885,735 A | * 3/1999 | Imai et al. | 430/5 |
| 5,900,338 A | 5/1999 | Garza et al. | 430/5 |
| 5,900,340 A | 5/1999 | Reich et al. | 430/22 |
| 5,920,487 A | 7/1999 | Reich et al. | 716/21 |
| 6,004,699 A | * 12/1999 | Yasuzato et al. | 430/5 |
| 6,077,310 A | * 6/2000 | Yamamoto et al. | 716/19 |
| 6,127,071 A | * 10/2000 | Lu | 430/5 |
| 6,136,478 A | * 10/2000 | Usui et al. | 430/5 |
| 6,178,360 B1 | * 1/2001 | Pierrat et al. | 700/121 |
| 6,194,104 B1 | * 2/2001 | Hsu | 430/5 |
| 6,218,057 B1 | * 4/2001 | Cirelli et al. | 430/5 |
| 6,269,472 B1 | * 7/2001 | Garza et al. | 716/21 |
| 6,282,696 B1 | * 8/2001 | Garza et al. | 716/19 |

* cited by examiner

SEMICONDUCTOR DEVICE FABRICATION USING A PHOTOMASK WITH ASSIST FEATURES

FIELD OF THE INVENTION

The present invention relates generally to semiconductor devices and photomasks and more particularly to a method of adding assist features to a photomask and integrated circuits formed using such a photomask.

BACKGROUND OF THE INVENTION

The manufacture of semiconductor devices is heavily dependent on the accurate replication of computer-aided-design (CAD) generated patterns onto the surface of a device substrate. The replication process is typically performed using optical lithography followed by a variety of subtractive (e.g., etch) and additive (e.g., deposition) processes. Optical lithography patterning involves the illumination of a metallic coated quartz plate known as a photomask which contains a magnified image of the computer generated pattern to be etched into the metallic layer. This illuminated image is reduced in size and patterned into a photosensitive film on the substrate.

As a result of the interference and processing effects which occur during pattern transfer, images formed on the substrate deviate from their ideal dimensions and shape as represented by the computer images. These deviations depend on the characteristics of the patterns as well as on a variety of process conditions. Because these deviations can significantly effect the performance of the semiconductor device, many approaches have been pursued which focus on CAD compensation schemes which ensure a resultant ideal image.

One such compensation scheme utilizes the selective biasing of mask patterns to compensate for the pattern distortions occurring during wafer processing. The term Optical Proximity Correction (OPC) is commonly used to describe this process of selective mask biasing, even though the trend exists to include pattern distortions unrelated to the optical image transfer. The idea of biasing patterns to compensate for image transfer infidelities has been commonly applied to E-beam lithography to counteract the effects of back scattered electrons, both in the writing of photo masks and in direct wafer writing operations.

Another known compensation technique is to add assist features, otherwise known as scattering bars or intensity leveling bars, to the photomask. Assist features are sub-lithographic features placed adjacent to a feature that is to be printed. Since these additional features are sub-lithographic, they will not be transferred to the resist during printing. They will, however, aid in sharpening the image that is printed.

It is well known that adding assist features to a photomask can help to improve the process window for printing isolated features. It is also known that the number of assist features that should be placed in the space between two critical features and the size of the assist features should be adjusted depending on the spacing between the critical features, among other things. What is not well known, however, is how to determine the optimum sizes and spacings for assist features in a real design containing critical features of varying size and a continuum of spacings between critical features. This task is complicated by the random nature and large data sizes of semiconductor designs.

At this point in time, commercially available software packages have taken two approaches to assist feature generation. The first (e.g., ASML MaskTools) is a straight rules based approach, where a simple set of assist feature design rules are used to generate assist features, along with applying rules based OPC to critical features. The second approach (e.g., Avant!) is to try to improve upon the rules based corrections, by using iterative model based corrections to the critical features after the assist features have been added. The problems with both of these approaches is that they are based on a simple rules based addition of the assist features, where generally up to two assist features can be added in the space between the two critical features. More than two assist features have been demonstrated but only at a fixed spacing between the critical feature and assist features.

SUMMARY OF THE INVENTION

In one aspect, the present invention provides an assist feature design method that is robust enough to handle varying critical feature sizes and a continuum of spacings between critical features. This method is also a computationally efficient rules-based approach that is capable of adding the correct number and size assist features to all spaces, including those bordered by line-end serifs or anchors. The assist feature design generation tool of the preferred embodiment is also robust enough to handle a wide variety of designs and also computationally efficient enough to be able to correct an entire chip in a reasonable amount of time.

In one aspect, the present invention provides a method of manufacturing a semiconductor device. Before the device can be fabricated, a layout of original shapes is designed. This layout represents elements (e.g., metal or polysilicon lines, areas to be etched) that are to be incorporated into the semiconductor device. For at least some, and preferably all, of the original shapes, the width of the shape and a distance to at least one neighboring shape are measured.

A modified shape can then be generated by moving edges of the original shape based on the width and distance measurements. This modification can be performed on some or all of the original shapes.

For each of the modified shapes, a distance between the modified shape and at least one neighboring shape is measured. A normalized space count can then be determined by dividing the measured distance by a normalized space constant and taking the integer value. The normalized space count can be used to determine a correct number of assist features and a normalized space. For example, the correct number of assist features can be determined by subtracting one from the normalized space count. The normalized space can be determined by dividing the measured distance by the normalized space count.

The layout is then modified by adding the correct number of assist features in a space between the modified shape and the neighboring shape. This modified layout can then be used in producing a photomask. The photomask can in turn be used to produce a semiconductor device.

In developing the preferred embodiment of the present invention, we have shown that simple rules based assist placement approaches are inadequate. For more isolated lines, several assist features are preferably used, and, for lines that have had serifs added to their ends, less assist features may be required at the line ends than over the rest of the line length. Although the iterative approach can help to improve feature uniformity and can better account for line-end effects, this approach does not always improve the process latitude to print these features, because it does not allow the addition or subtraction of assist features.

The preferred method of the present invention that applies OPC and adds assist features to a photomask design is both accurate and efficient. Its efficiency, or speed, is derived from using a rules based approach to determine the design modifications. Its accuracy is due to its ability to add various numbers of assist features with varying sizes and locations to a design. In this method, the photomask design is modified by a software tool that we will call the correction routine.

BRIEF DESCRIPTION OF THE DRAWINGS

The above features of the present invention will be more clearly understood from consideration of the following descriptions in connection with accompanying drawings in which.

DETAILED DESCRIPTION

The making and use of the presently preferred embodiments are discussed below in detail. However, it should be appreciated that the present invention provides many applicable inventive concepts that can be embodied in a wide variety of specific contexts. The specific embodiments discussed are merely illustrative of specific ways to make and use the invention, and do not limit the scope of the invention.

The present invention will now be described using a specific example. It will be clear to one skilled in the art that the principles described with respect to the specific example can be extended to a number of semiconductor device applications.

Figures 1A, 1B:
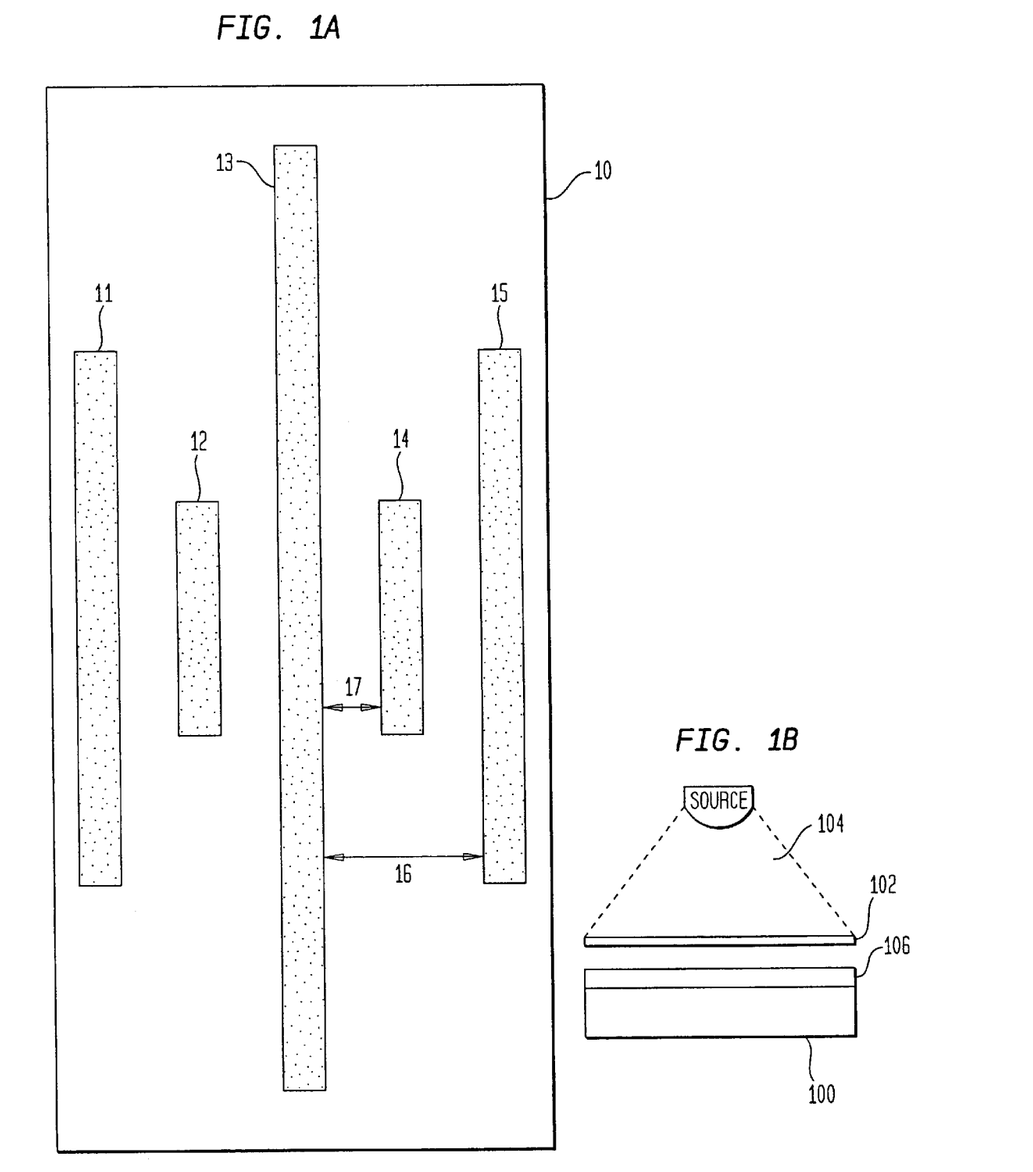
FIG. 1A illustrates a simplified pattern that is to be printed on a semiconductor device and FIG. 1B illustrates a simplified schematic of a lithography exposure system.

FIG. 1A illustrates a pattern 10 that is to be transferred to a semiconductor wafer 100 (see FIG. 1B) using photolithographic techniques. For example, the elements 11–15 might all be polysilicon lines that are to be formed on the surface of the semiconductor device. In an ideal world, a photomask 102 would be formed that included the pattern 10. Light (or other radiation) 104 could then be transmitted through the photomask 102 and the pattern transferred onto a resist layer 106 formed on an upper surface of the semiconductor device 100.

Figure 2A:
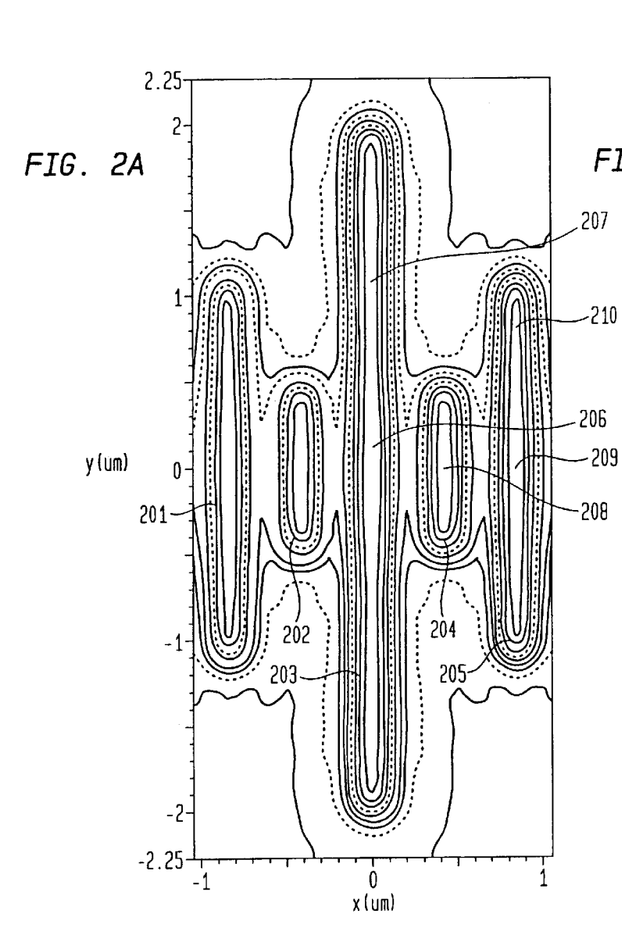
FIG. 2A illustrates the pattern that might be transferred to the wafer if the photomask is not corrected when the image is in focus, and 2B illustrates this pattern when the image is 0.5 um out of focus.
Figure 2B:
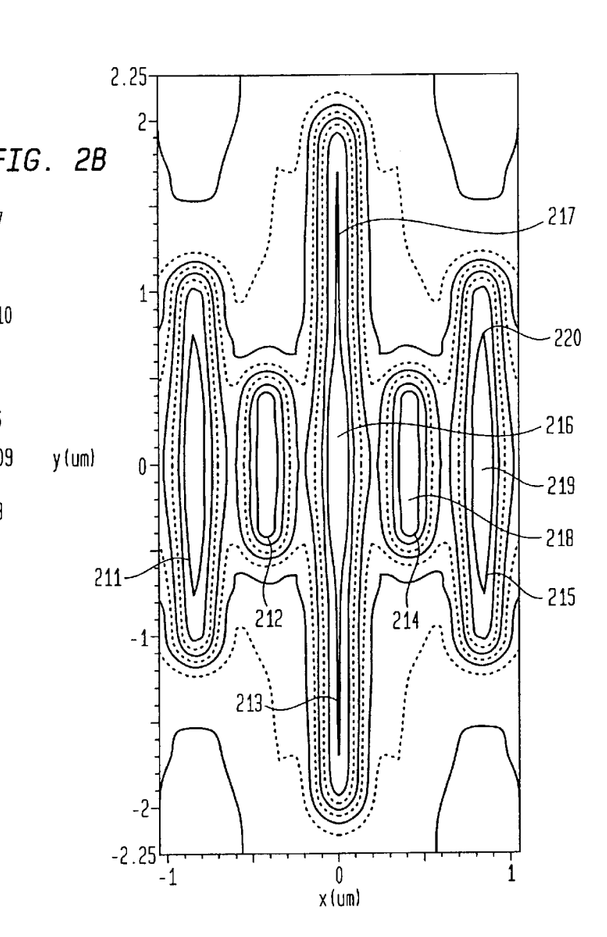

Unfortunately, due to optical proximity effects, the pattern 10 will not be reliably transferred to the photoresist. For example, FIGS. 2A and 2B illustrate the pattern that is transferred to the photoresist when the image is in focus (FIG. 2A) and out of focus by 0.5 um (FIG. 2B). If a thresholding photoresist is used and the dose is set to a value of 3.3 times the dose-to-clear (i.e., the dose just required to develop the resist in a large clear area), then intensities of less than or equal to 0.3 will print as lines in photoresist. These thresholds are labeled 201–205 in FIG. 2A and 211–215 in FIG. 2B. It is evident that the more isolated regions of the lines, e.g., 207 and 210 in FIG. 2A and 217 and 220 in FIG. 2B, print smaller than the more nested regions, e.g., 206, 208 and 209 in FIG. 2A and 216, 218 and 219 in FIG. 2B.

In one aspect, the present invention proposes a compensation method that will eliminate much of the distortion shown in FIG. 2. In the preferred embodiment, the method applies optical proximity correction (OPC) and adds assist features to the photomask design. In this method, the photomask design is modified by a software tool that can be referred to as a correction routine.

Figure 3A:
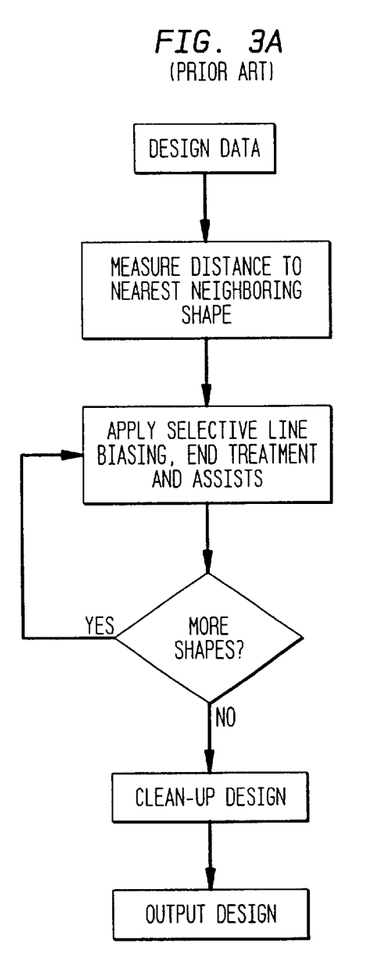
FIGS. 3A and 3B provide flow charts of a prior art correction routines.
Figure 3B:
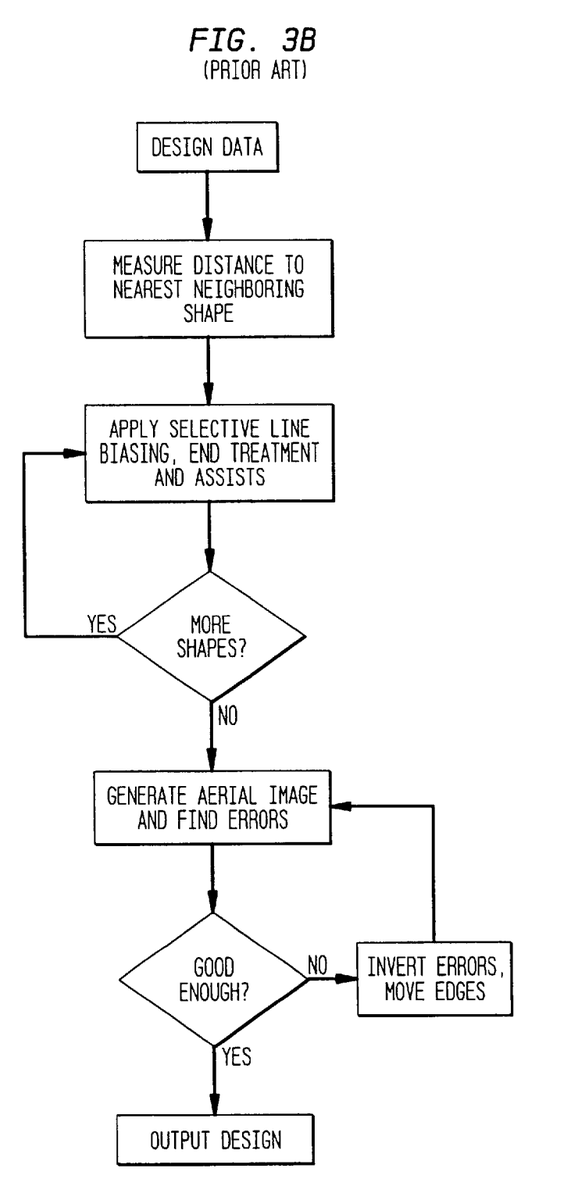

A flow chart for each of two prior art correction routines are shown in FIGS. 3A and 3B. FIG. 3A shows the flow for a simple rules based approach, where the design data is passed through a single pass correction routine that modifies shape edges, adds corner treatments and assist features all in one step. FIG. 3B shows how a model based correction can be used to improve a design that has had assists added using a rules based approach.

Figure 4A:
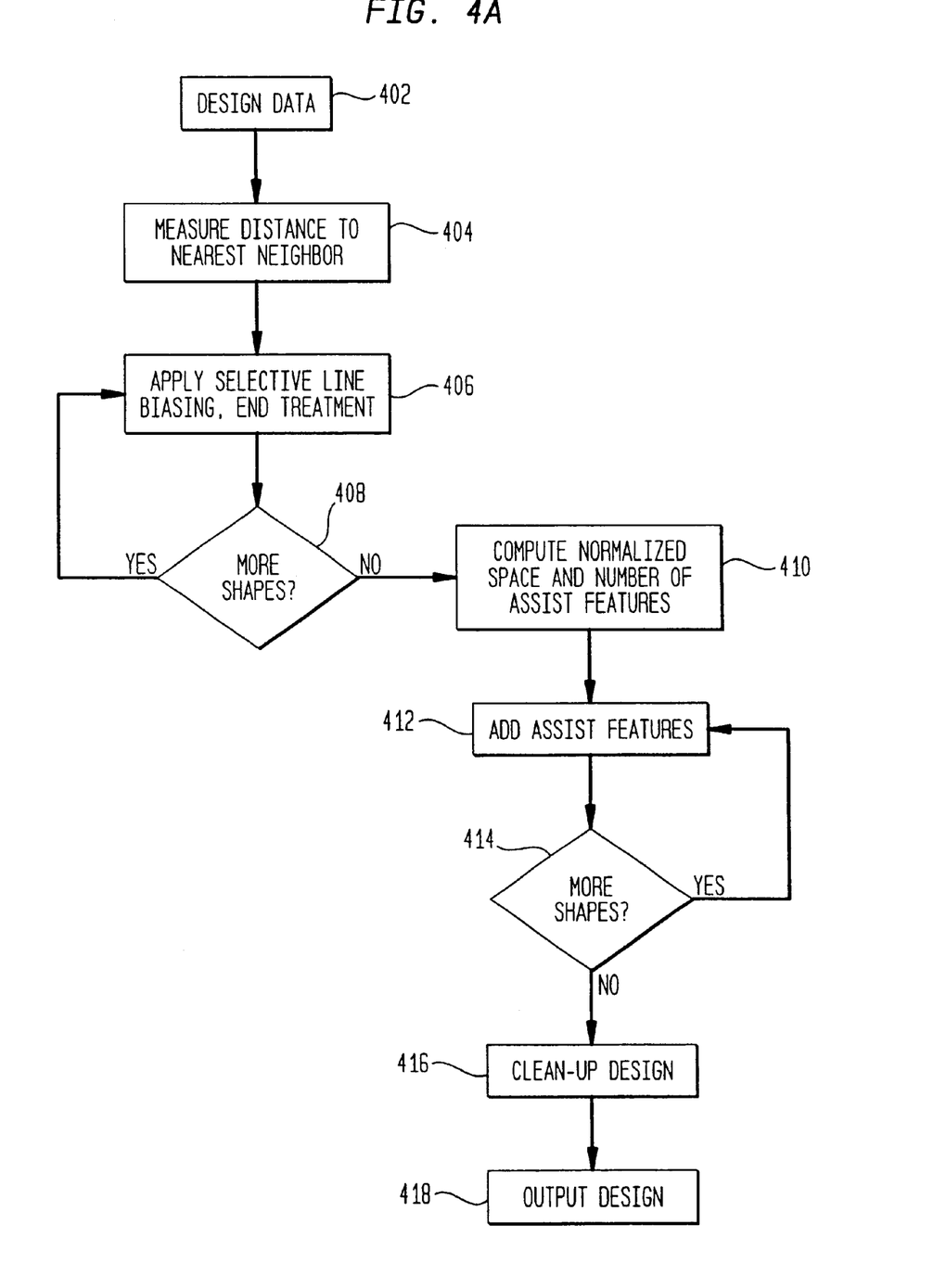
FIGS. 4A and 4B provides a flow chart of a preferred embodiment correction routine.
Figure 4B:
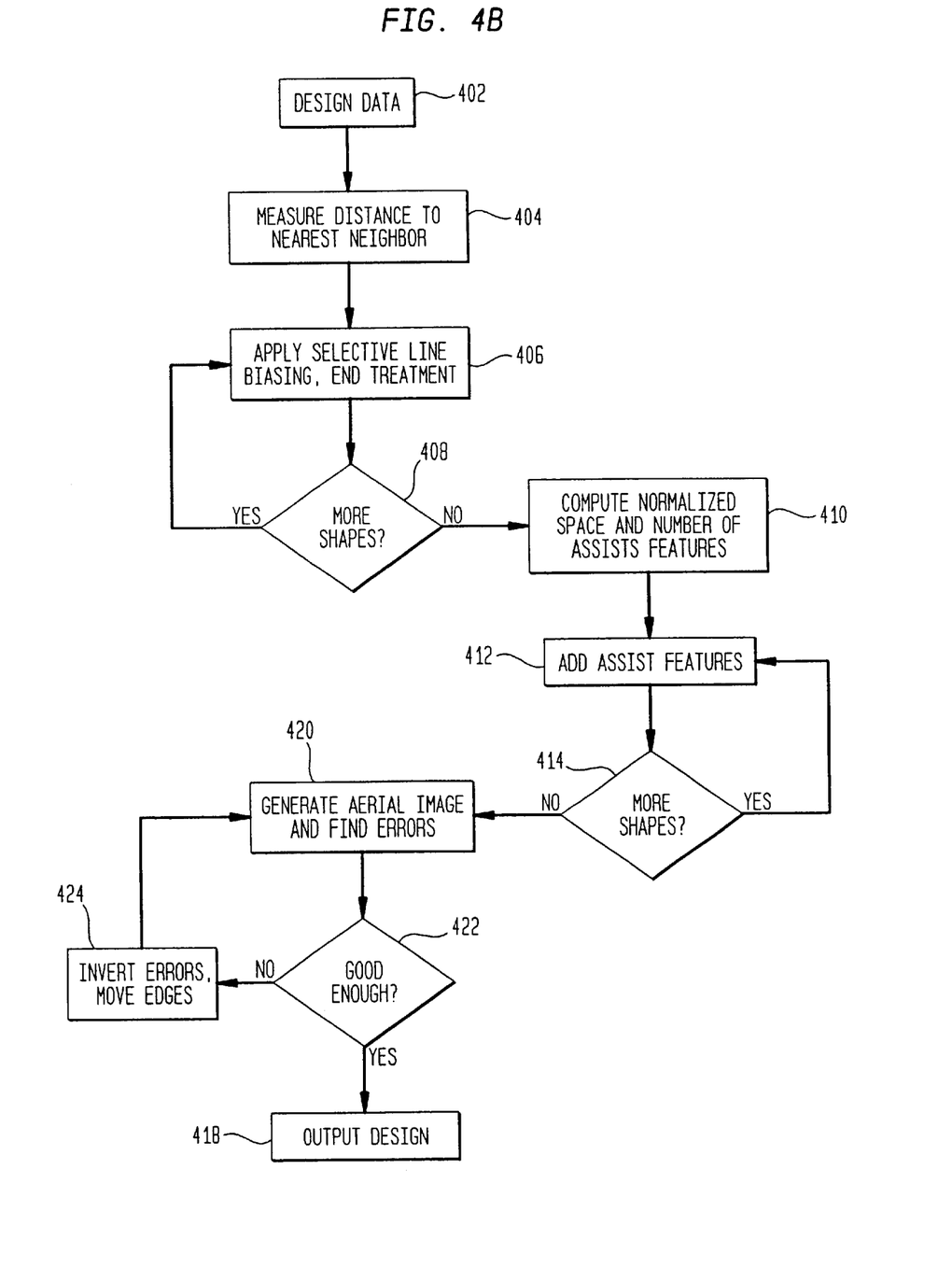

A flow chart illustrating the steps of the preferred embodiment correction routine is shown in FIGS. 4A and 4B. In FIG. 4A, the selective line biasing and corner treatment are done in a first pass through the data. A second pass is then taken where the number of assist features are computed and the normalized space size is used to size and place the assists. In FIG. 4B, this rules based approach is followed by a model based correction for further refinements.

Referring now to FIG. 4A, the routine begins with design data (step 402), for example, that was derived from a computer-aided design (CAD) system. This design data lays out the ideal patterns for the integrated circuit (see e.g., FIG. 1). The shapes in this layer (e.g., 11–15) can be referred to as original shapes or designed shapes.

In step 404, the routine measures the distance from a first shape (e.g., element 12 in FIG. 1) to that shape's nearest neighbor(s) (e.g., elements 11 and 13). The routine will then apply selective line biasing and end treatments (step 406). This process will be repeated for each of the elements in the circuit (step 408). It is noted that at this point no assist features have been added.

Figure 6:
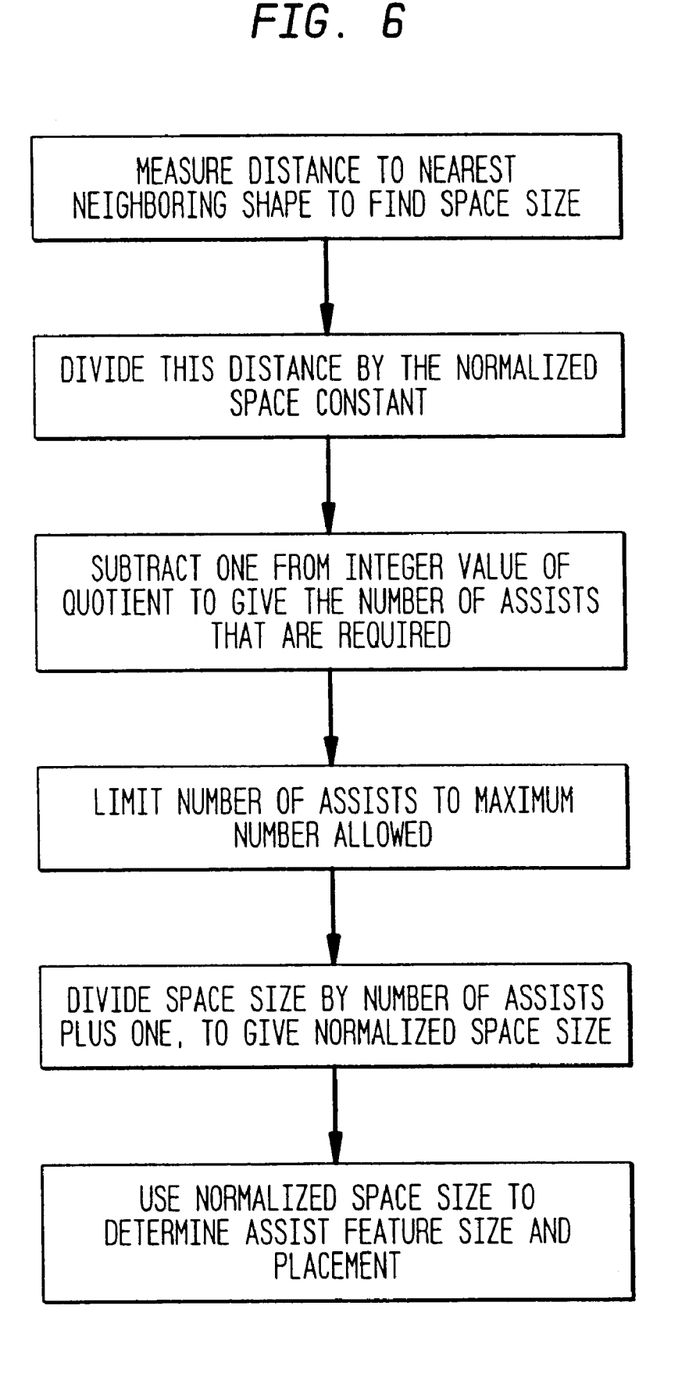
FIG. 6 provides a flow chart of the space size computation routine of the preferred embodiment.

After the line biasing and end treatments have been completed for each of the shapes, the routine will compute the normalized space and compute the number of assist features (step 410). Assist features will then be added as required (steps 412 and 414). One preferred embodiment routine for deriving assist features will be discussed below, for example, with respect to FIG. 6.

After assist features are added, the design will be cleaned up (step 416) and outputted (step 418). These steps are well known in the art. The clean up step is included to improve mask manufactureability and typically includes removing jogs in the assist features and ensuring that minimum spacings are enforced. The design in typically outputted to a file that is sent to a mask writing tool.

FIG. 4B illustrates an alternate embodiment technique. In this embodiment, steps 402–414 are the same as those in FIG. 4A. In this routine, however, aerial images are generated after the assist features are added (step 10 420). This routine find errors and move edges of the shapes until these errors are minimized (steps 422, 424).

Figure 5:
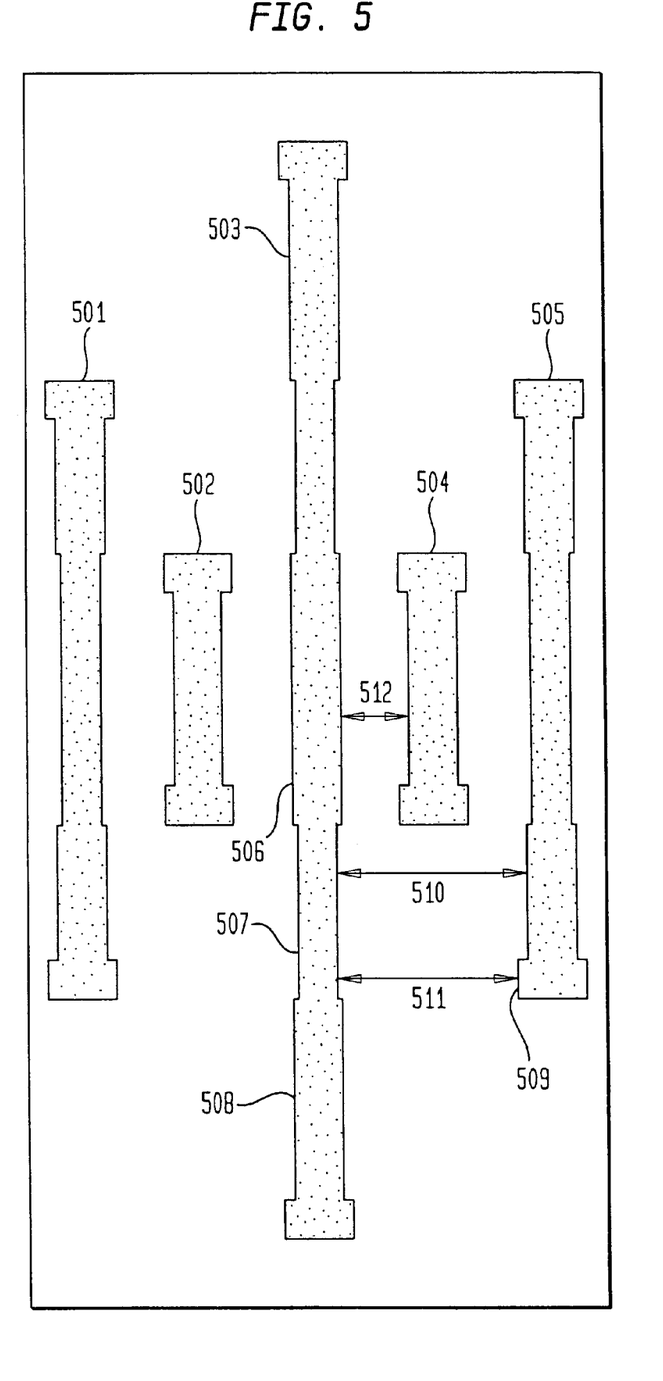
FIG. 5 illustrates the pattern of FIG. 1 after the line biasing and end treatment steps.

Initially, this routine analyzes the shapes in a design and applies corrections to those shapes by moving their edges. As shown in FIG. 5, this correction will cause the shape's size to increase or decrease. This part of the process is similar to standard line biasing and end treating OPC, and will be considered the critical feature correction step.

The amount of correction is determined by the size of the critical feature and the distance to its nearest neighboring shape. Before this step is carried out, the distance to the nearest neighboring shape is considered the designed space size. After this step has been completed across the entire region of interest, the distance between the critical feature and its nearest neighboring shape (also corrected) is considered the corrected space size.

FIG. 5 illustrates the corrected mask pattern for the pattern 10 of FIG. 1 after the critical feature correction step. Here, different line biasing can be seen in sections 506–508 and the addition of line-end anchors can also be seen, such as 509.

The next step in the correction routine is to add assist features to the design where appropriate. This portion of the correction routine is illustrated by the flow chart of FIG. 6. To add the assist features, the routine considers all of the corrected spaces in the design. For a given space, the correct assist feature layout is determined by first dividing the corrected space size by a constant, the space size constant.

The space size constant is typically set by determining the minimum space that can support an assist feature. Even for an ideal photomask and exposure system, this value is found to be a function of the mask bias and lambda/NA where lambda is the illumination wavelength and NA is the numerical aperture of the imaging system. The value becomes more difficult to define when mask CD (critical dimension) errors, aberrations and process variations are accounted for. For a state of the art exposure system and mask making process, this value typically falls between 0.4*(lambda/NA) and 0.65*(lambda/NA). In practice, it is often very close to half of the minimum pitch that needs to be imaged.

After the corrected space size is divided by the space size constant, the routine takes the integer value of the resulting quotient. Subtracting one from the integer value gives the number of assist features that should be placed in the corrected space. Dividing the corrected space size by the integer value gives the normalized space size. This normalized space size can be used to determine the correct assist feature sizes and locations.

This method may best be understood by way of an example. Returning to FIGS. 1 and 5, if designed space size 16 is equal to 665 nm, then this space may require that the edges bordering this space be moved outward by 15 nm, so that the OPC corrected space 510 becomes 635 nm (665-2*15=635). Likewise, if designed space 17 is 245 nm, then this space may require 17.5 nm edge adjustments resulting in the OPC corrected space 512 being 210 nm (245-2*17.5= 210). Similarly, if a 35 nm wide edge serif 509 is placed on the ends of line 505, the resulting space 511 is reduced to 600 nm (63535=600).

For an exposure system using 248 nm illumination (i.e., lambda) and having an NA of 0.6, a typical space size constant is around 210 nm (0.5*lambda/NA=0.5*248/ 0.6☐210). The correct number of assist features to be placed in each of the three spaces 510–512 is found by dividing the OPC space size by the space size constant, taking the integer value and subtracting one. This is shown here:

| Space 510 | INT(635/210) − 1 = 2 |
| Space 511 | INT(600/210) − 1 = 1 |
| Space 512 | INT(210/210) − 1 = 0. | where INT(x) is the integer value of x.

Once the correct number of assist features have been determined, the normalized space size is determined by dividing the corrected space size by one more than the number of assists. This is shown here:

| Space 510 | 635/(2 + 1) = 212 |
| Space 511 | 600/(1 + 1) = 300 |
| Space 512 | 210/(0 + 1) = 210. |

The normalized space size can then be used to look up the correct assist sizes and locations. This can be accomplished by way of a look up table or through functional forms.

Figure 7:
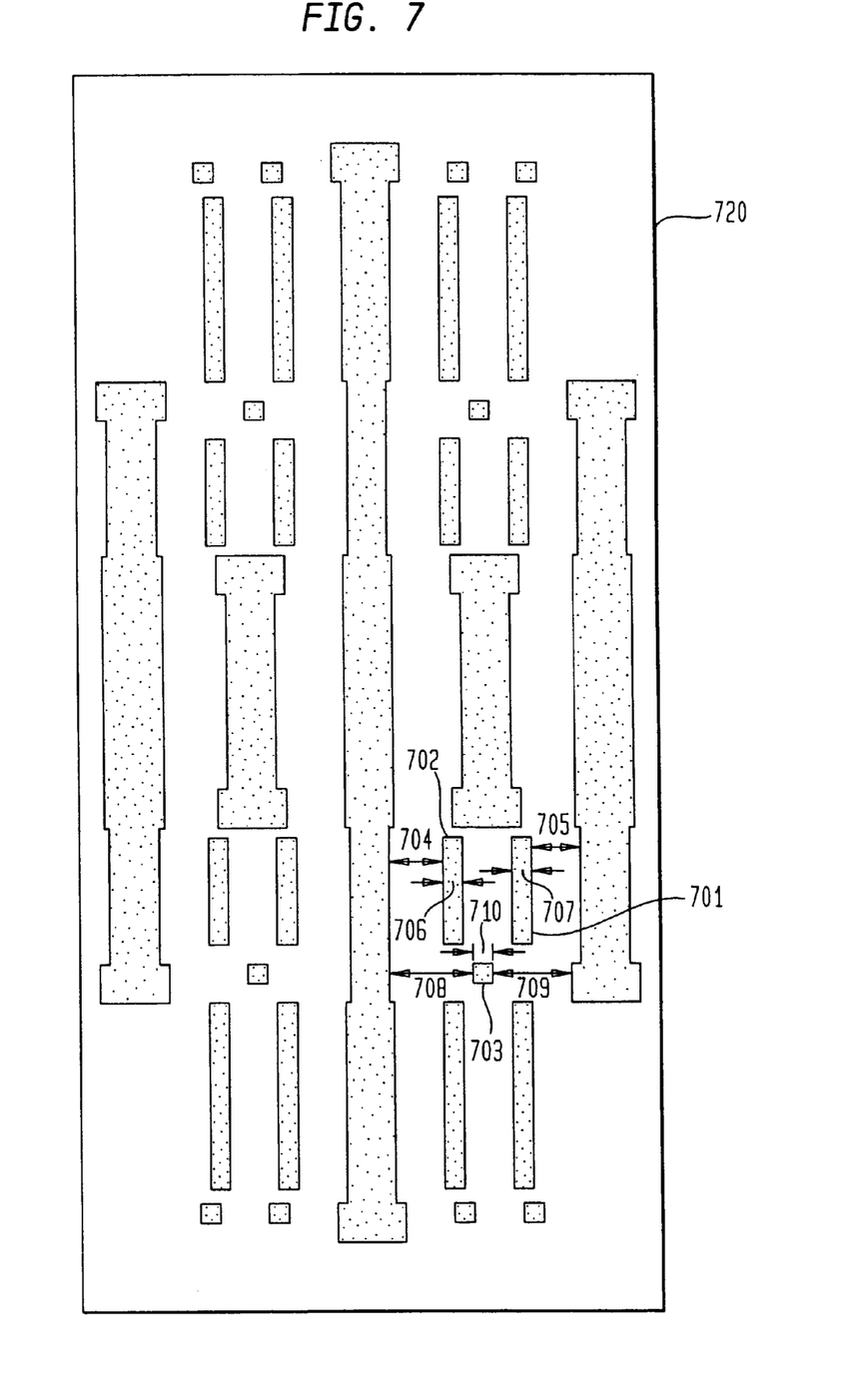
FIG. 7 illustrates the pattern of FIG. 5 after the addition of assist features.

In FIG. 7, assist features have been generated and placed using this approach. In this example, the assist feature sizes, 706–707 and 710, were all set to 80 nm and only the placement needed to be determined. Assist features 701 and 702 were placed in the space 510 from FIG. 5. From a look up table, distances 704 and 705 were set to 155 nm. Likewise, assist feature 703 was placed in the space 511 from FIG. 5 and was centered, so that 708 and 709 were set to 280 nm. It should also be noted, that after the assists were placed, a cleanup routine was applied to ensure better mask manufactureability. In this step, the ends of the assist features were pulled back as required so that they did not run into each other or other shapes.

Figure 8A:
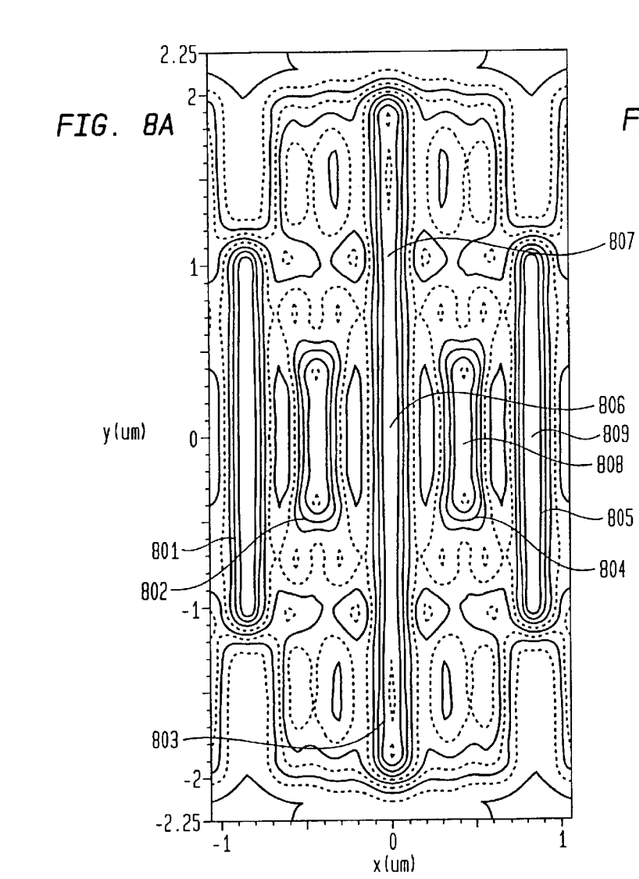
FIG. 8A illustrates the pattern that might be transferred to the wafer if the photomask is corrected when the image is in focus, and 8B illustrates this pattern when the image is 0.5 um out of focus.
Figure 8B:
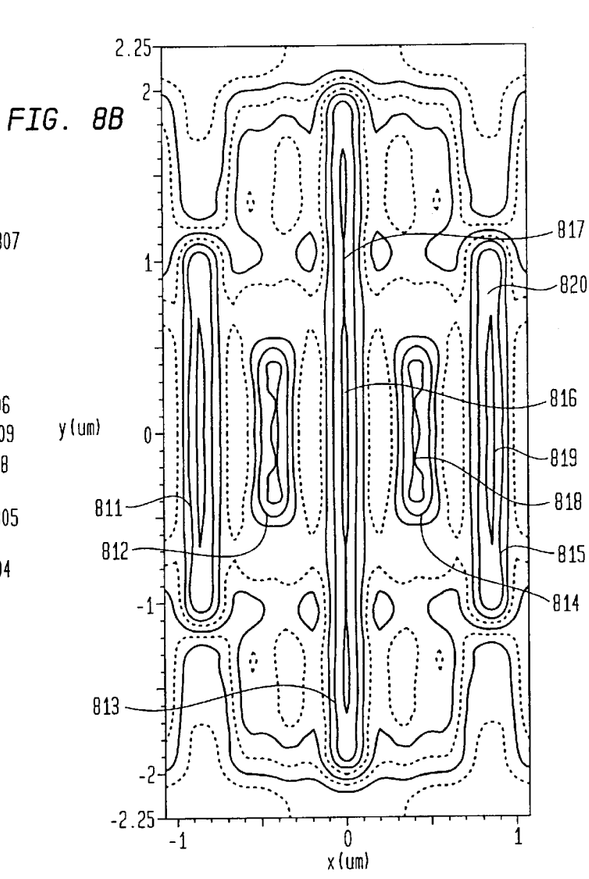
Figure 9A:
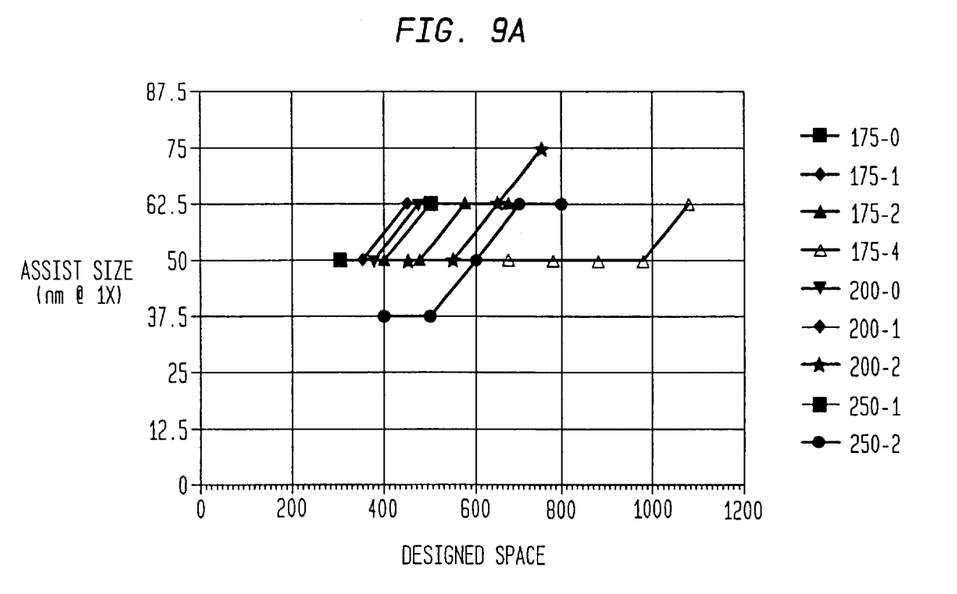
FIGS. 9A–9B and 10A–10B illustrate two sets of plots that demonstrate one advantage of the preferred embodiment.
Figure 9B:
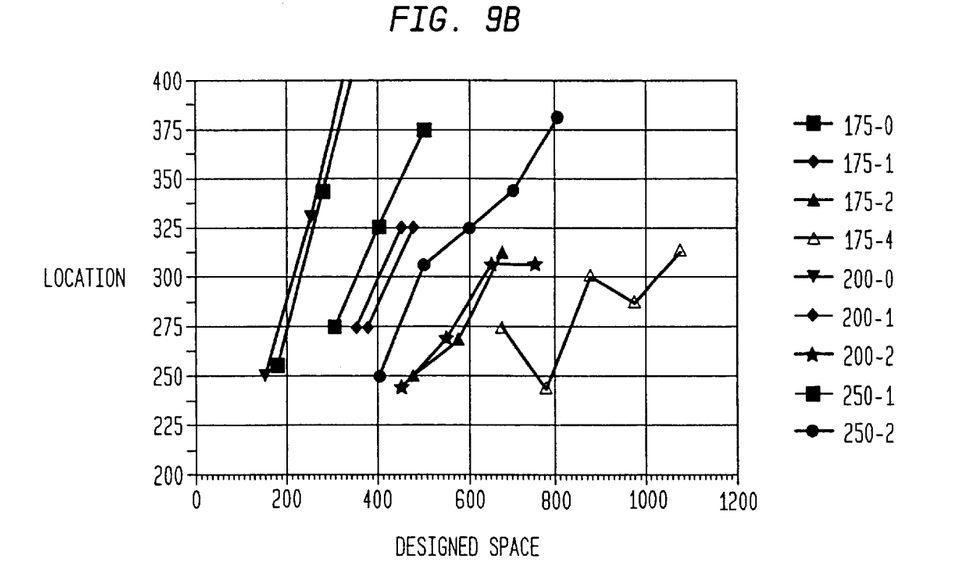

FIGS. 8A and 8B illustrate the pattern that is transferred to the photoresist when the pattern 720 from FIG. 7 is imaged in focus (FIG. 8A) and out of focus by 0.5 um (FIG. 8B). If the dose is again set so that regions with intensities of less than or equal to 0.3 will print as lines in photoresist, the printed images will be bounded by the contours labeled 801–805 in FIG. 8A and 811–815 in FIG. 8B. Comparing FIG. 8 to FIG. 2, it is evident that the lines are straighter, longer and more uniform. This is especially evident in the more isolated regions of the lines in the out of focus images, 217 and 220 in FIG. 2B and 817 and 820 in FIG. 8B.

Figure 10A:
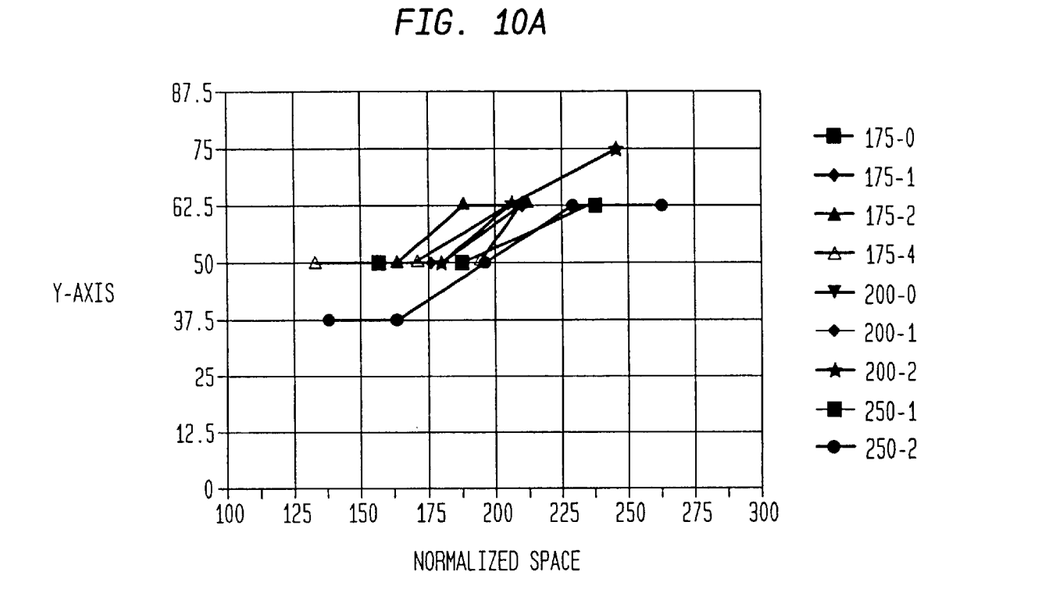
Figure 10B:
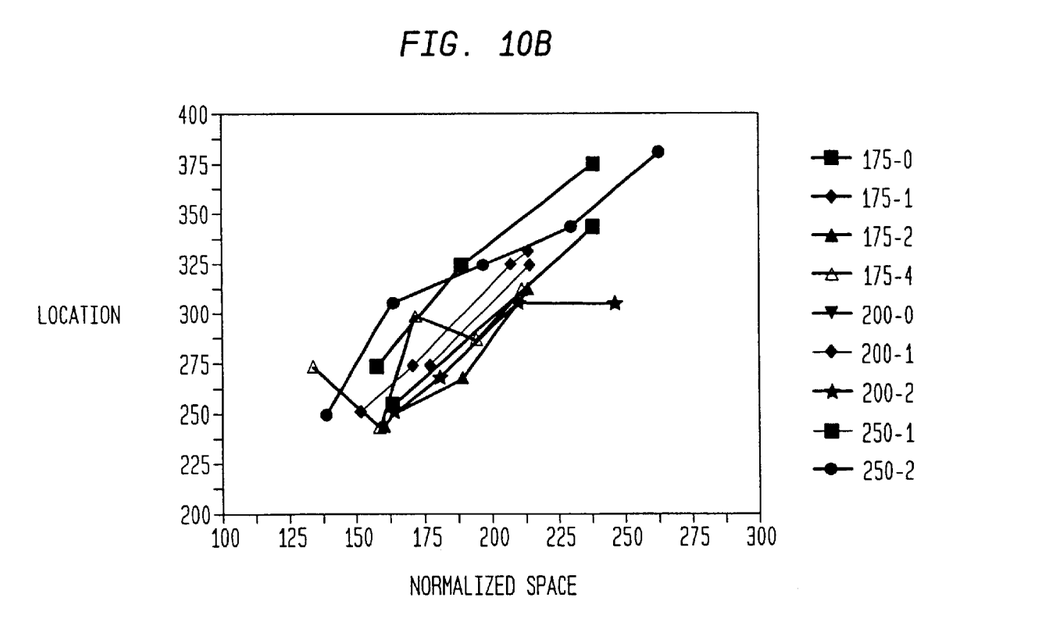

The benefit of the normalized space approach to determining correction values can be seen from the following plots of FIGS. 9A and 9B (collectively FIG. 9) and FIGS. 10A and 10B (collectively FIG. 10). In each of the plots, three different critical feature sizes (175 nm, 200 nm and 250 nm) are studied over a range of pitches starting at 350 nm and increasing to 1250 nm, which is essentially isolated. In the set of plots shown in FIG. 9 a standard space-centric correction approach is used, where the designed space is used to determine the number, size and locations of assist features.

It is evident from these plots that a large range of spaces must be accounted for, but that the assist feature sizes and locations can vary rapidly across a small range. This problem results in the necessity of a very large correction table to determine the proper assist feature layouts—which leads to computational inefficiencies.

The preferred method of the present invention is demonstrated in the set of plots shown in FIG. 10. In these plots, the range of spaces has been reduced by a factor of six. For comparison, in both figures, the tick marks are one design grid apart. In the preferred method, all curves essentially fall on top of each other to +/−1 grid point. Although the larger lines (250 nm) are slightly different than the smaller ones, these lines should be easier to print and can tolerate a non-optimal condition.

It is evident, that the preferred method significantly reduces the range of space sizes that must be corrected, while also allowing the same corrections to be used for any number of assist features. It is expected that this reduction in correction table size should significantly improve correction speed.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of manufacturing a semiconductor device, the method comprising:

designing a layout of a plurality of original shapes that are to be incorporated into the semiconductor device;

for at least some of the plurality of original shapes, measuring the width of the original shape and a distance to at least one neighboring shape;

generating a modified shape by moving edges of the original shape based on the width and distance measurements;

for each of the modified shapes, measuring a distance between the modified shape and at least one neighboring shape;

determining a normalized space count by dividing the measured distance by a normalized space constant and taking an integer value;

determining a correct number of assist features by subtracting one from the normalized space count;

determining a normalized space by dividing the measured distance by the normalized space count;

modifying the layout by adding the correct number of assist features in a space between the modified shape and the neighboring shape;

producing a photomask based upon the modified layout; and using the photomask to produce a semiconductor device.

2. The method of claim 1 wherein size and placement of the assist features are determined according to correction tables based on the normalized space.

3. The method of claim 1 wherein the plurality of original shapes include every shape in the layout.

4. The method of claim 1 wherein the semiconductor device comprises a dynamic random access memory.

5. The method of claim 1 wherein the normalized space constant is between about 0.4*(lambda/NA) and about 0.75* (lambda/NA), where in lambda is an illumination wavelength for the photomask and NA is a numerical aperture of an imaging system that will use the photomask.

6. The method of claim 5 wherein the normalized space constant is in the range of 0.4*(lambda/NA) to 0.55* (lambda/NA).

7. The method of claim 1 wherein the photomask includes a minimum pitch and wherein the normalized space constant is essentially equal to about half of the minimum pitch.

8. The method of claim 1 wherein the space constant is determined through simulation.

9. The method of claim 1 wherein the space constant is determined through experimentation.

10. The method of claim 1 wherein determining the correct number of assist features further comprises comparing the space constant with one more than a maximum number and, if the result exceeds the maximum, setting the correct number of assist features to the maximum number.

11. The method of claim 10 wherein the maximum number is two (2).

12. The method of claim 10 wherein the maximum number is four (4).

13. The method of claim 10 wherein edges next to spaces for which the result exceeds the maximum are considered isolated and treated consistently.

14. The method of claim 1 and further comprising performing a model based correction after modifying the layout.

15. The method of claim 14 and further comprising a clean up step to improve mask manufactureability, the clean up step performed before the model based correction.

16. The method of claim 14 and further comprising a clean up step to improve mask manufactureability, the clean up step performed after the model based correction.

17. The method of claim 1 and further comprising a clean up step to improve mask manufactureability, the clean up step performed after modifying the layout.

18. The method of claim 1 wherein size and placement of the assist features are determined according to correction functions based on the normalized space.

19. The method of claim 18 wherein the correction functions are linear functions.

20. The method of claim 18 wherein the correction functions are quadratic functions.

21. The method of claim 18 wherein the correction functions are cubic functions.

22. A method of modifying the design of a photomask, the design of the photomask including a plurality of shapes, each shape being adjacent to at least one neighboring shape, the method comprising:

(a) measuring a distance between a shape and a neighboring shape;

(b) determining a normalized space count by dividing the measured distance by a normalized space constant and taking an integer value;

(c) determining a correct number of assist features by subtracting one from the normalized space count;

(d) determining a normalized space by dividing the measured distance by the normalized space count; and (e) adding the correct number of assist features to the design of the photomask in a space substantially between the shape and the neighboring shape, wherein the assist features each have a size and placement that are determined based on the normalized space.

23. The method of claim 22 wherein steps (a) through (e) are repeated for each of the plurality of shapes in the design.

24. The method of claim 22 and further comprising using the photomask to produce a semiconductor integrated circuit.

25. The method of claim 22 and further comprising performing a model based correction after modifying the layout.

26. A correction routine for use in modifying the design of a photomask, the correction routine comprising:

(a) measuring a width of a designed shape and a distance to nearest neighboring shapes of the designed shape;

(b) moving edges of the designed shape based on measurements performed in step (a) to generate a modified shape;

(c) repeating steps (a) and (b) for each other designed shape that is desired to be modified;

(d) measuring a distance between each modified shape and its nearest neighboring shapes;

(e) determining a normalized space count by dividing the measured distance by a normalized space constant and taking an integer value;

(f) determining a correct number of assist features by subtracting one from the normalized space count;

(g) determining a normalized space by dividing the measured distance by the normalized space count;

(h) adding the number of assist features to the design of the photomask in a space substantially between the shape and the neighboring shape, wherein the assist features each have a size and placement that are determined based on the normalized space.

27. The method of claim 26 and further comprising modifying ends of the designed shapes to compensate for line-end shortening and/or corner rounding, the step of modifying the ends being performed prior to measuring a distance between each modified shape and its nearest neighboring shapes.

28. The method of claim 26 and further comprising creating edge adjustment shapes based on measurements performed in step (a), the edge adjustment shapes generally being placed on an OPC design level that differs from an original design level, the step of creating edge adjustment shapes being performed prior to measuring a distance between each modified shape and its nearest neighboring shapes.

29. The method of claim 28 wherein the assist features are added to an assist feature design level that differs from the OPC design level and the original design level.

30. The method of claim 29 wherein, once step (h) has completed, the original design level, the OPC level and the assist feature level are unioned to give a final design.

31. The method of claim 26 and further comprising:
creating edge adjustment shapes based on measurements performed in step (a), the edge adjustment shapes being placed on an OPC design level that differs from an original design level; and
creating end shapes, the end shapes being placed on the original design level.

32. The method of claim 26 and further comprising using the photomask to produce a semiconductor integrated circuit.

33. A method of modifying the design of a photomask, wherein for a plurality of shapes in the design a correction routine is applied, the correction routine comprising:

(a) measuring a width of a designed shape and a distance from the designed shape to its nearest neighboring shapes;

(b) generating a modified shape by moving edges of the designed shape based on measurements performed in step (a);

(c) repeating steps (a) and (b) for each of the plurality of shapes in the design;

(d) determining an OPC space by measuring a distance from a modified shape to a nearest neighboring shape; and (e) adding a correct number of assist features in a space between the modified shape and the nearest neighboring shape, wherein the assist features have a size and placement that are determined according to correction tables or correction functions based on the measured OPC space;

(f) repeating steps (d) and (e) for each of the plurality of shapes in the design.

34. The method of claim 33 wherein the correct number of assist features is greater than one.

35. The method of claim 33 wherein the correct number of assist features is between one and four.

36. The method of claim 33 and further comprising using the photomask to produce a semiconductor integrated circuit.

37. A method of modifying the design of a photomask, wherein for a plurality of shapes in the design a correction routine is applied, the correction routine comprising:

(a) measuring a width of a designed shape and a distance from the designed shape to its nearest neighboring shapes;

(b) generating a modified shape by moving edges of the designed shape based on measurements performed in step (a);

(c) repeating steps (a) and (b) for each of the plurality of shapes in the design;

(d) determining an OPC space by measuring a distance from a modified shape to a nearest neighboring shape; and (e) adding a correct number of assist features in a space between the modified shape and the nearest neighboring shape, wherein the assist features have a size and placement that are determined according to correction tables or correction functions based on the measured OPC space, wherein the correct number of assist features is determined by:
(i) calculating a divisor by dividing the OPC space by a normalized space constant; and
(ii) determining the correct number of assist features by taking an integer value of the divisor and subtracting one;

(f) repeating steps (d) and (e) for each of the plurality of shapes in the design wherein the correct number of assist features is determined by:
calculating a divisor by dividing the OPC space by a normalized space constant;
determining the correct number of assist features by taking an integer value of the divisor and subtracting one.

38. The method of claim 37 and further comprising using the photomask to produce a semiconductor integrated circuit.

39. A method of modifying the design of a photomask, the design of the photomask including a plurality of shapes, each shape being adjacent to at least one neighboring shape, the method comprising:

(a) measuring a distance between a shape and a neighboring shape;

(b) determining a normalized space count by dividing the measured distance by a normalized space constant and taking an integer value;

(c) determining a correct number of assist features by subtracting one from the normalized space count;

(d) determining a normalized space by dividing the measured distance by the normalized space count;

(e) adding a number of assist features to the design of the photomask in a space substantially between the shape and the neighboring shape, wherein the assist features each have a size and placement that are determined based on the normalized space.

(f) repeating steps (a) through (e) for each of the plurality of shapes in the design;

(g) measuring a distance between a designed shape and a neighboring shape or assist feature;

(h) generating a modified shape by moving edges of the designed shape based on measurement performed in step (g);

(i) repeating steps (f) through (h) for each of the plurality of shapes in the design.

40. The method of claim 39, further comprising:

forming a layer of resist on an upper surface of a semiconductor device;

directing radiation through the photomask and toward the semiconductor device;

removing portions of the resist; and effecting the semiconductor device at areas associated with the removed portions of the resist.

41. A photomask comprising:

a plurality of lithographic patterns formed in a substrate, each of the lithographic patterns comprising a substantially transparent material; and a plurality of sub-lithographic patterns formed in the substrate, each of the sub-lithographic patterns comprising a substantially transparent material;

wherein at least two of the sub-lithographic patterns are disposed in a region between two neighboring ones of the lithographic patterns.

42. A method of using the photomask of claim 41, the method comprising:

forming a layer of resist on an upper surface of a semiconductor device;

directing radiation through the photomask and toward the semiconductor device;

removing portions of the resist; and effecting the semiconductor device at areas associated with the removed portions of the resist.

43. A photomask comprising:

a substrate;

a first lithographic pattern disposed on the substrate;

a first sub-lithographic pattern disposed on the substrate and spaced from the first lithographic pattern;

a second sub-lithographic pattern disposed on the substrate and spaced from the first sub-lithographic pattern such that the first sub-lithographic pattern is between the second sub-lithographic pattern and the first lithographic pattern; and a second lithographic pattern disposed on the substrate and spaced from the second sub-lithographic pattern such that the first and second sub-lithographic patterns are between the second lithographic pattern and the first lithographic pattern.

44. A method of using the photomask of claim 43, the method comprising:

forming a layer of resist on an upper surface of a semiconductor device;

directing radiation through the photomask and toward the semiconductor device;

removing portions of the resist; and effecting the semiconductor device at areas associated with the removed portions of the resist.

\* \* \* \* \*